(12) United States Patent
Liu

(10) Patent No.: US 6,228,689 B1
(45) Date of Patent: *May 8, 2001

(54) TRENCH STYLE BUMP AND APPLICATION OF THE SAME

(75) Inventor: Hermen Liu, Taoyuan Hsien (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/085,206

(22) Filed: May 27, 1998

(30) Foreign Application Priority Data

Apr. 18, 1998 (TW) .................................. 87105972

(51) Int. Cl.$^7$ .................................................. H01L 21/44
(52) U.S. Cl. .......................... 438/131; 438/132; 438/251
(58) Field of Search ..................................... 427/123, 305, 427/328, 433, 438; 148/23, 24, 25, 26; 438/106, 131, 132, 251, 109; 228/201, 202, 203; 357/68, 65, 75, 55

(56) References Cited

U.S. PATENT DOCUMENTS

| 4,187,868 | * | 2/1980 | Rudolphi ........................... 134/184 |
| 4,478,364 | * | 10/1984 | Ditzig ................................. 228/201 |
| 4,992,847 | * | 2/1991 | Tuckerman et al. ................. 357/68 |
| 5,672,548 | * | 9/1997 | Culane et al. ...................... 437/209 |
| 5,785,799 | * | 7/1998 | Culane et al. ...................... 156/379 |
| 5,795,619 | * | 8/1998 | Lin et al. ............................ 427/123 |
| 5,847,929 | * | 12/1998 | Berneir ................................ 361/719 |
| 5,900,738 | * | 5/1999 | Khandros et al. ................... 324/761 |
| 5,906,312 | * | 5/1999 | Zakel et al. ......................... 228/246 |

* cited by examiner

Primary Examiner—Charles Bowers
Assistant Examiner—Laura Schillinger
(74) Attorney, Agent, or Firm—Thomas, Kayden, Horstemeyer & Risley

(57) ABSTRACT

A trench style bump and the application of the same. A trench style bump is formed on a silicon chip. The silicon chip is laminated on a substrate which has a circuit built inside and an anisotropic conductive film/anisotropic conductive paste formed thereon. During lamination, an ultra sonic wave is used to vibrate the substrate laterally, so that the conductive particles contained within the anisotropic conductive film/anisotropic conductive past are effectively trapped by the trench on the trench style bump.

10 Claims, 7 Drawing Sheets

TRENCH STYLE BUMP AND APPLICATION OF THE SAME

CROSS-REFERENCE TO RELATED APPLICATION

This application claims the priority benefit of Taiwan application serial no. 87105972, filed Apr. 18, 1998, the full disclosure of which is incorporated herein by reference.

BACKGROUND OF THE INVENTION

1. Field of the Invention

The invention relates to a trench style bump and its fabrication method, and more particular, to an application of employing the trench style bump into flip chip technique, such as chip on glass (COG) and ball grid array (BGA).

2. Description of the Related Art

Integration circuits (ICs) have reached every part of our daily lives. However, the process of fabricating an IC is very complex. Hundreds of steps are needed for making an IC. The fabrication normally takes one or two month to complete. The IC industry is a high technology industry including four main branches: IC design, wafer fabrication, wafer testing, and wafer packaging. Thus, IC industry is not only an advanced technology industry, but also a high risky industry which needs a tremendous capital to maintain.

In a conventional package of an IC chip, a lead frame is used to electrically connect a semiconductor and an external wire of the package. However, as the integrated circuit grows more and more delicate and complex, the required wire increases greatly in the same package volume. The traditional lead frame technique can not meet the requirement at all. Therefore, to develop a new package which contains and connects more conducting wires are required.

One of the package technique which accommodates a large number of wires is BGA package. A BGA package is normally in a square shape in which the conducting terminal is in a form a solder ball. This terminal is designed and installed on a bonding pad of a printed wire board (PWB), a printed circuit board (PCB), or some other devices to connected.

In practice, a conventional BGA is a miniature of a multi-layered PCB, which comprises an IC chip, to electrically connect each other via various ways. The connections between conductors are achieved by via or plug.

Another design which accommodates and connect a large number of wires in a limited region is glass on chip (COG). The wiring or circuit is built in a glass substrate. Through some conducting device or terminal on the chip, for example, gold bump, the chip is coupled directly to the circuit in the glass substrate.

FIG. 1a to FIG. 1f show a conventional method of fabricating a gold bump. Referring to FIG. 1a, an aluminum (Al) pad 102 and a passivation layer 104 are formed on a silicon chip 100. A wafer cleaning step is performed on the silicon chip 100.

In FIG. 1b, an under bump material (UMB) 106 which comprises a titanium tungsten layer (TiW) 106A and a gold layer 106B is formed over the silicon chip 100.

In FIG. 1c, using a photo-mask, a photo-resist layer 108 with an opening 110 aligned with the Al pad 102 therein is formed over the UBM 106. In FIG. 1d, a gold layer 110A is formed to fill the opening 110.

In FIG. 1e, the photo-resist layer 108 is removed, and then the UBM 106 is removed to complete the formation of a gold bump 106B shown as FIG. 1f.

FIG. 2a to FIG. 2b show a conventional method of employing the above metioned gold bump structure a flip chip technique. In FIG. 2a, a substrate 200, for example, a glass substrate or a printed circuit board is provided. A cleaning process is performed on the substrate 200 first. On the substrate 200, an anisotropic conductive film (ACF) or an anisotropic conductive paste (ACA) 202 is formed. In the figure, the particles contained by the ACF/ACA 202 represent the conductive particles.

In FIG. 2b, a silicon chip 100 having a gold bump 110B as described above is laminated on the substrate 200. It is known that the substrate 200 normally includes an organic material. In the case of printed circuit board, bismalemide triazine (BT) compound is used to form a printed circuit board. This kind of material is easily bent and deformed due to thermal expansion, moisture, or inappropriate handle. As shown in the figure, the deformation causes a bad contact between the gold bump and the substrate. Consequently, an open circuit is very likely to happen. In addition, if the surface level of the gold bump 100 is formed non-uniformly, the open circuit is even more obvious.

SUMMARY OF THE INVENTION

It is therefore an object of the invention to provide a trench style metal bump of a chip and a method of fabricating the same. The formation of a trench in the metal bump causes the conductive particles in the ACF/ACA to be trapped therewithin. Therefore, the bad contact caused by the bent substrate or uneven surface of the bump is improved.

It is therefore another object of the invention to provide a method of laminating a silicon chip having a trench style bump with the substrate with a good contact. An ultra sonic vibration is performed to the substrate laterally during lamination, so that the conductive particles in the ACF/ACA are trapped within the trench more effectively. As a consequence, the bad contact between the bump and the substrate is further improved.

To achieve these objects and advantages, and in accordance with the purpose of the invention, as embodied and broadly described herein, the invention is directed towards a method of fabricating a trench style bump. A silicon chip which comprises a metal pad, a passivation layer on a part of the silicon chip which is not covered by the metal pad, and a under bump material over the silicon chip, is provided. A first photo-resist layer is formed and patterned, so that a first opening aligned with the metal pad is formed, and the under bump material is exposed within the first opening. A first bump material layer is formed to fill the first opening. A second photo-resist layer is formed and patterned, so that at least a second opening is formed on the first bump material layer, and the under bump material is exposed within the second opening. A second bump material layer is formed to fill the second opening. The first and the second photo-resist layers are removed, so that the first bump material layer and the second bump material layer are combined as one trench style bump. A part of the under bump material is removed with the trench style bump as a mask.

To achieve these objects and advantages, and in accordance with the purpose of the invention, as embodied and broadly described herein, the invention is directed towards a trench style bump, which is formed on a silicon chip comprising a metal pad and a passivation layer. The trench style bump comprises an under bump layer formed on the metal pad, and a bump having at least a trench on a surface thereof.

To achieve these objects and advantages, and in accordance with the purpose of the invention, as embodied and broadly described herein, the invention is directed towards a flip chip technique which employs a silicon chip having a trench style bump. A substrate on which an anisotropic conductive film/anisotropic conductive paste is formed is provided. The silicon chip is laminated on the substrate, so that the trench style bump is contacted with the substrate. The substrate laterally is vibrated using an ultra sonic wave, and a pressing force is applied on the silicon chip towards the substrate during vibration.

It is to be understood that both the foregoing general description and the following detailed description are exemplary and explanatory only and are not restrictive of the invention, as claimed.

DESCRIPTION OF THE PREFERRED EMBODIMENTS

In the invention, a trench style metal bump is provided and employed in a flip chip technique. In addition, an ultra sonic vibration is performed laterally to have the conductive particles trapped within the trench more effectively. Therefore, the bad contact and an open circuit due to a bent substrate and an uneven bump surface level are improved.

Figure 1A:
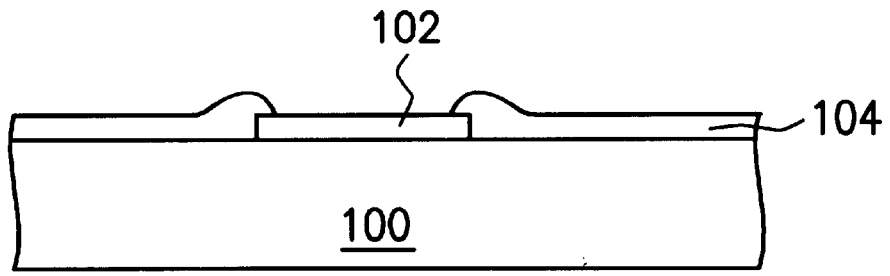
FIG. 1a to FIG. 1f show a conventional method of forming a gold bump on a silicon chip.
Figure 1B:
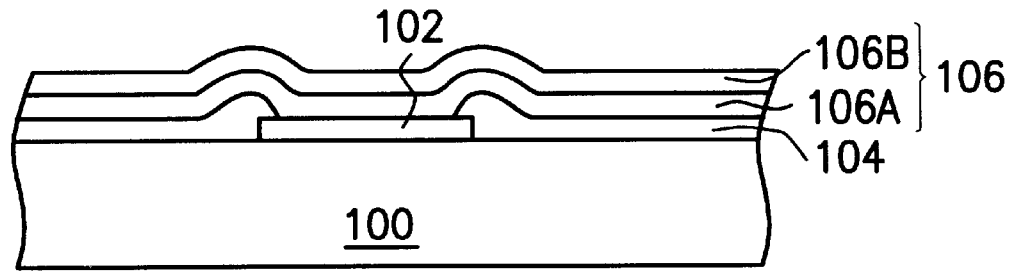
Figure 1C:
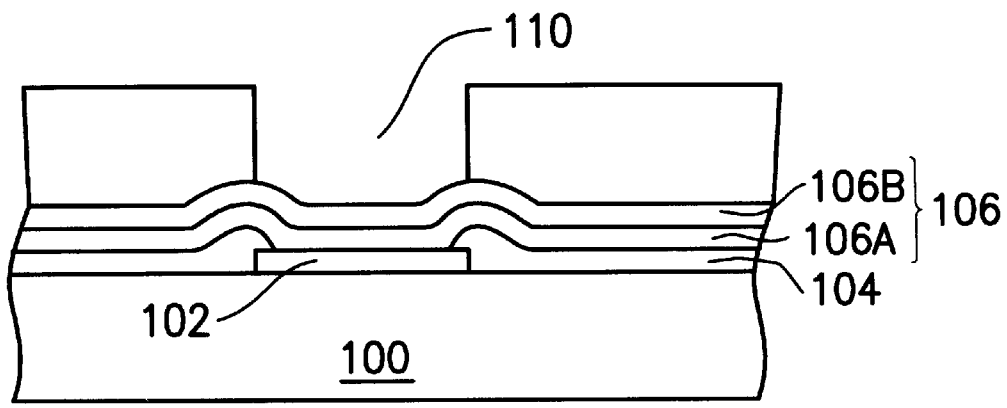
Figure 1D:
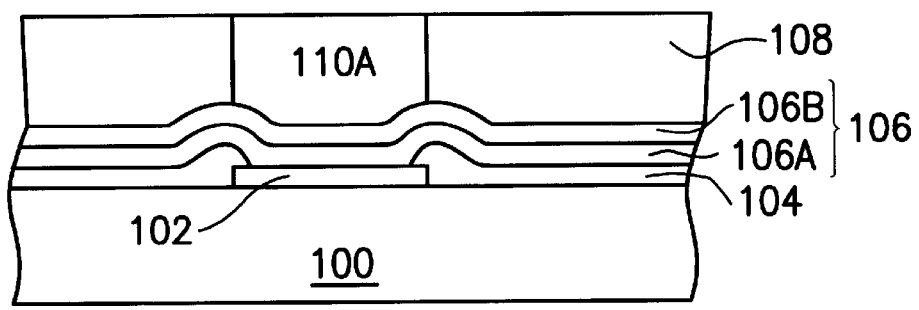
Figure 1E:
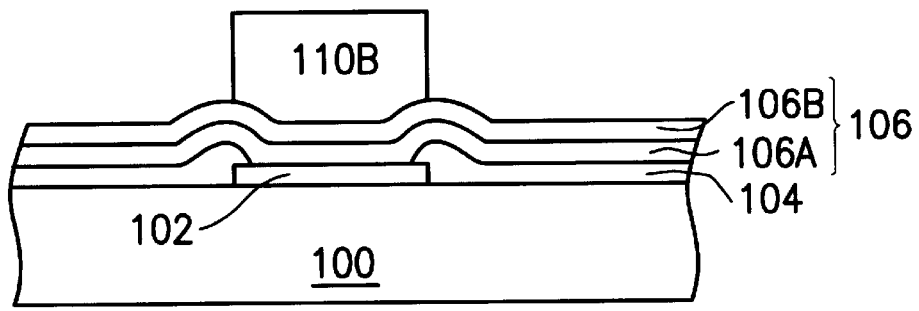
Figure 1F:
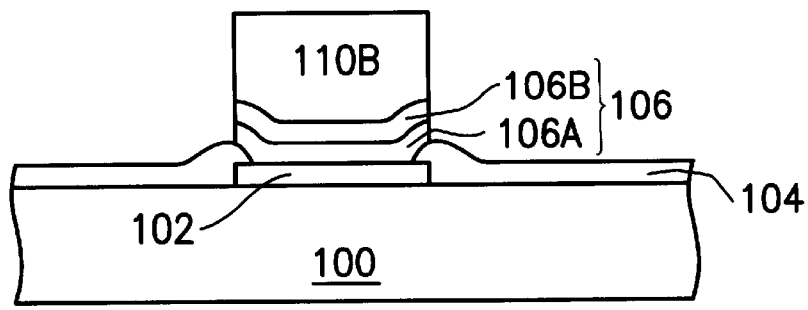
Figure 2A:
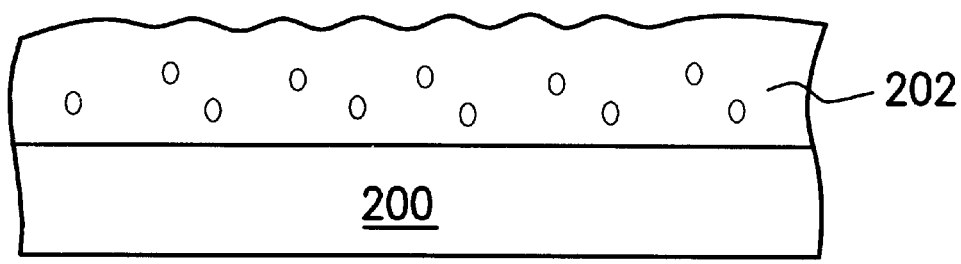
FIG. 2a to FIG. 2b show a conventional flip chip technique, in which the gold bump formed as FIG. 1a to FIG. 1f are employed.
Figure 2B:
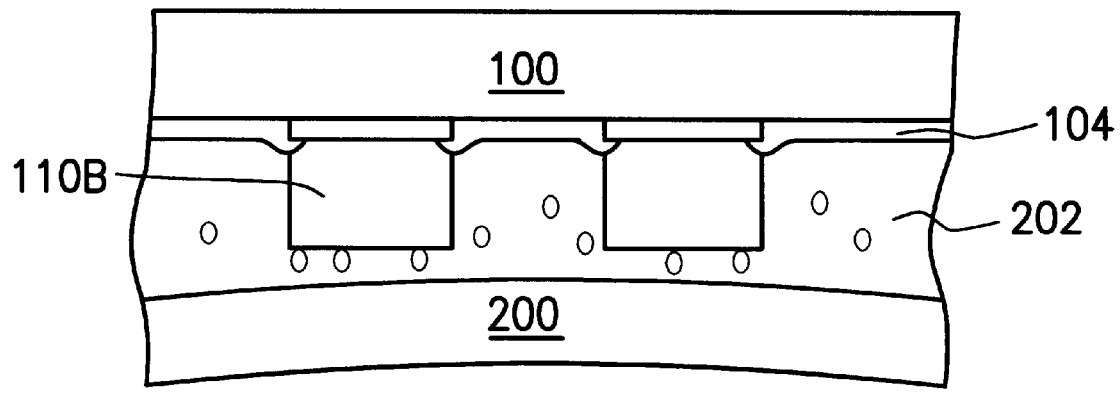
Figure 3A:
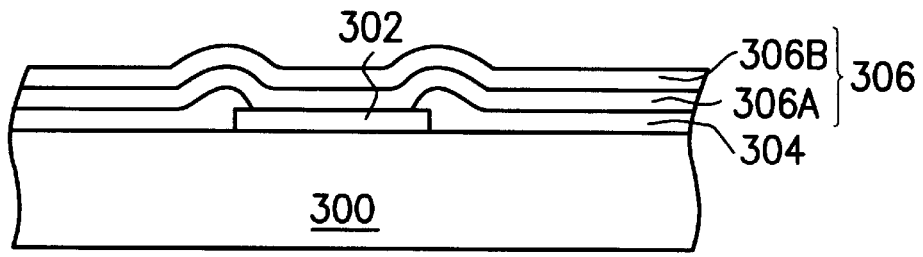
FIG. 3a to FIG. 3g show a method of fabricating a trench style metal bump in a preferred embodiment according to the invention.

FIG. 3a to FIG. 3g show a preferred embodiment according to the invention, in which a trench style bump is fabricated. In FIG. 3a, a metal pad 302, for example, an aluminum pad, is formed on a silicon chip 300, wherein the metal pad 302 covers a part of the silicon chip 300, leaving the other part of the silicon chip exposed. A passivation layer 304 is formed over the exposed silicon chip and an edge of the metal pad 302, so that a part of the passivation layer 304 swells around the edge of the metal pad 302. An under bump material 306 which comprises a titanuim tungsten layer 306A and a gold layer 306B is formed over the silicon chip 300 to cover the passivation layer 304 and the metal pad 302, wherein the under bump material 306 follows a contour of the passivation layer 304.

Figure 3B:
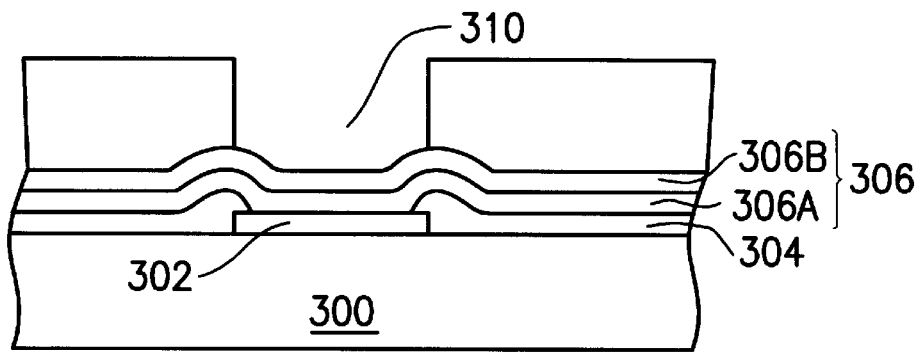

In FIG. 3b, using a photo-mask, a photo-resist layer 308 is formed and patterned to have an opening 300 aligned with the metal pad 302 formed therewithin. The under bump layer 306 is thus exposed within the opening 310.

Figure 3C:
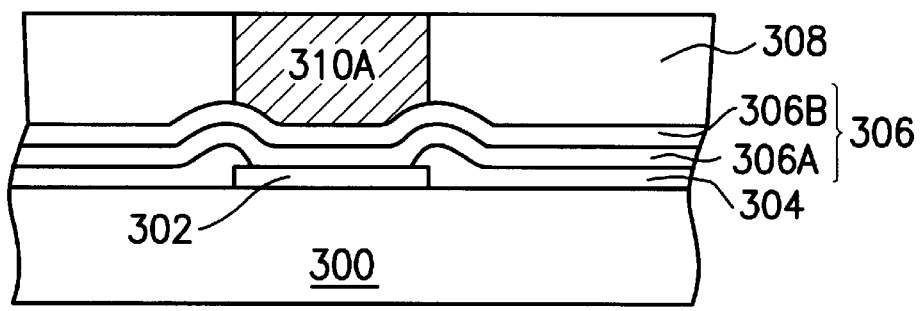

In FIG. 3c, a bump material layer 310A is formed to fill the opening 310, for example, a gold layer formed by deposition or plating.

Figure 3D:
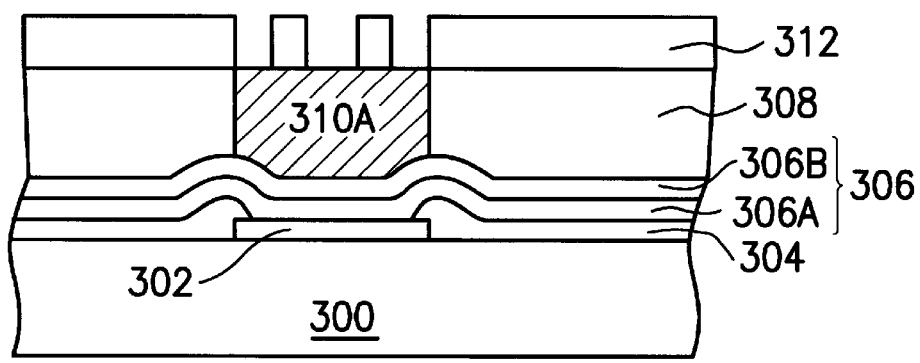
Figure 3E:
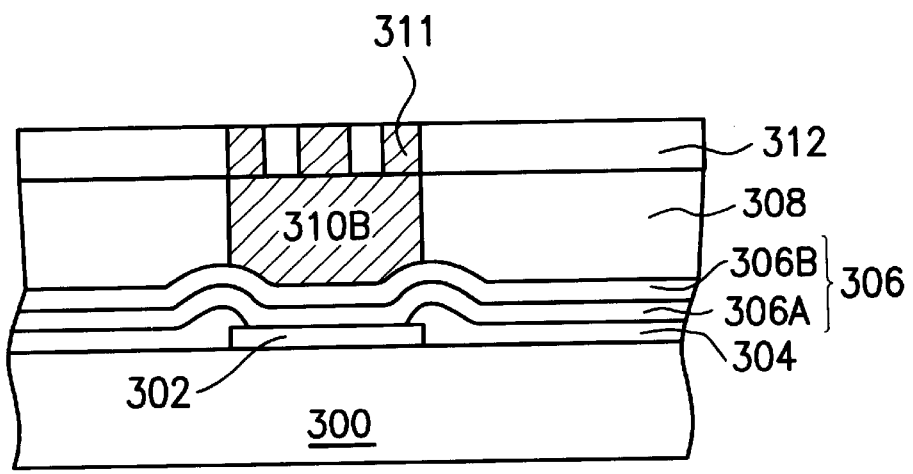

In FIG. 3d, using a photo-mask, another photo-resist layer 312 is formed and patterned over the silicon chip 300. At least an opening is formed on the bump material 310A to expose the bump material 310A. Similarly, a bump material layer 311 is formed to fill the opening, for example, a gold layer formed by deposition or plating. The resultant structure is shown as FIG. 3e.

Figure 3F:
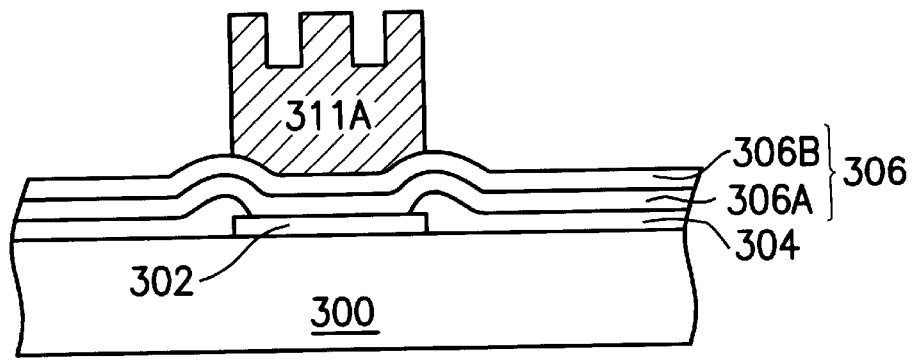

In FIG. 3f, the photo-resist layers 308 and 312 are removed. The bump materials 310A and 311 are combined as one trench style bump 311A.

Figure 3G:
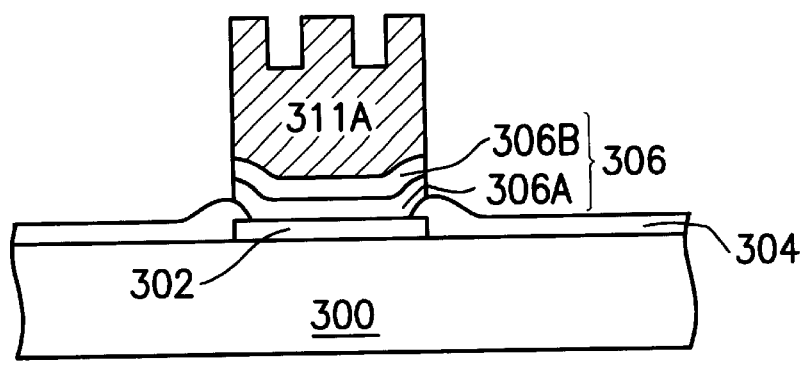

In FIG. 3g, using the trench style bump 311A as a mask, a part of the under bump material 306 which is covered by the trench style bump 311A is removed.

Figure 4A:
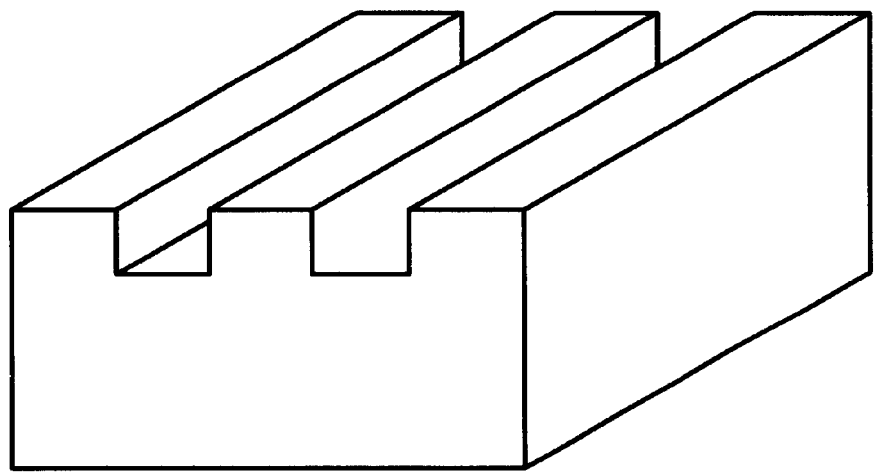
FIG. 4a and FIG. 4b show top views of different patterns of trench style metal bumps.
Figure 4B:
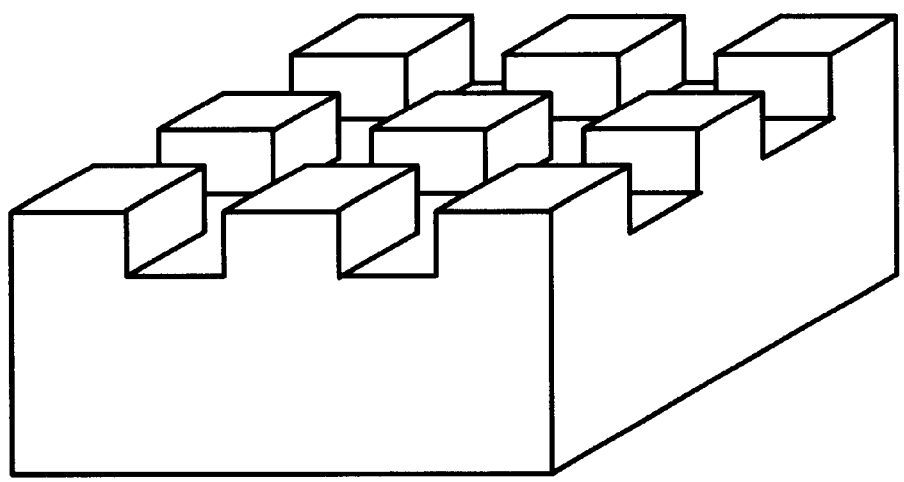

The trench pattern on the above trench style bump 311A can be designed according to practical requirement, for example, a parallel trench pattern of which the top view is shown as FIG. 4a, or a lattice pattern of which the top view is shown as FIG. 4b.

Figure 5A:
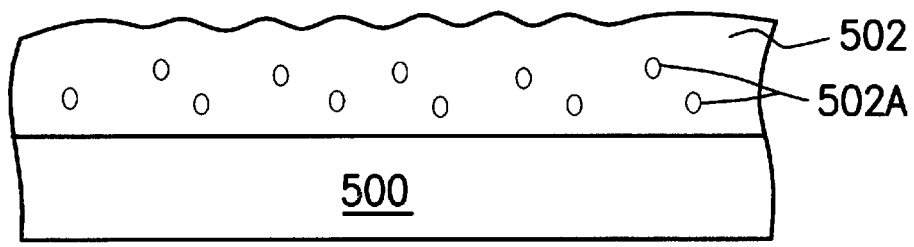
FIG. 5a to FIG. 5c show a method of employing the trench style metal bumps shown in FIG. 3a to FIG. 3g to flip chip technique in a preferred embodiment according to the invention.
Figure 5B:
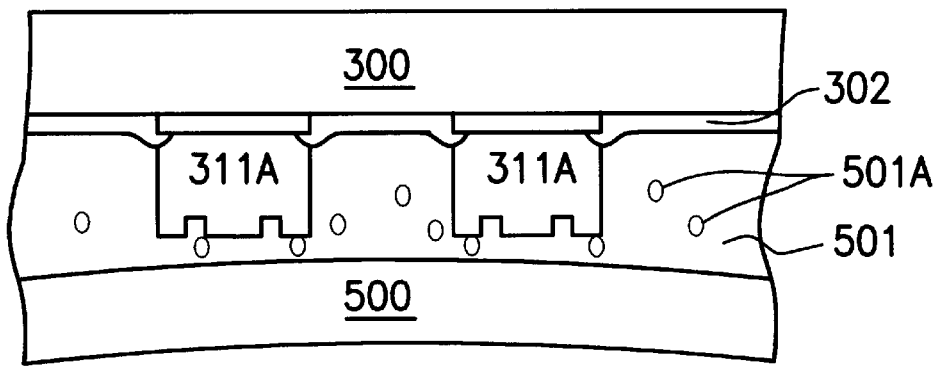
Figure 5C:
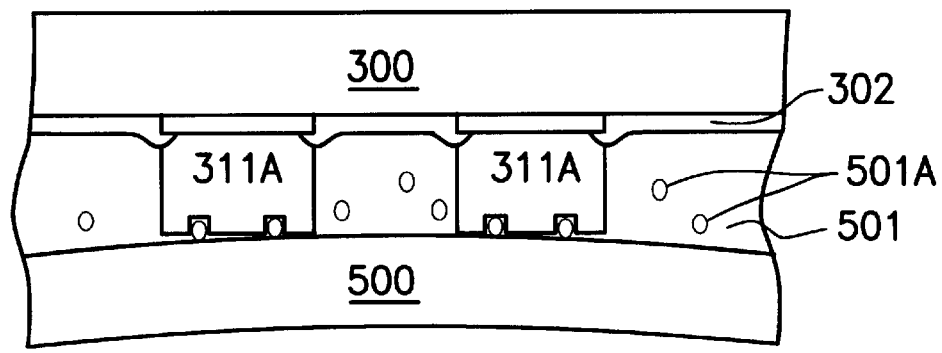

FIG. 5a to FIG. 5c show a method of employing the trench style bump into a flip chip technique.

In FIG. 5a, a substrate 500, for example, a glass substrate or a printed circuit board, is provided. A cleaning process is performed to the substrate 500. On the substrate 500, an ACF/ACA 502 containing conductive particles 502A is formed.

In FIG. 5b, a silicon chip 300 having a trench style bump 311A, for example, a trench style gold bump, is laminated on the substrate 500.

In FIG. 5c, an ultra sonic wave vibration is performed on the substrate 500 laterally, so that the conductive particles 502A shift left and right until being trapped by the trench on the trench style bump. While performing the ultra sonic vibration, a force is applied vertically to the substrate 500 to laminate the silicon chip 300 on the substrate 500.

In the invention, the conductive particles are trapped within the trench on the trench style bump effectively, so that the bad contact due to substrate bent or uneven surface level of bump is improved.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a trench style bump, comprising:

providing a silicon chip with a metal pad formed thereon, wherein the metal pad covers a part of the silicon chip;

forming a passivation layer over an edge of the metal layer and a part of the silicon chip which is not covered by the metal pad, so that a part of the passivation layer swells around the edge of the metal pad;

forming an under bump metal over the silicon chip to cover the passivation layer and the metal pad, wherein the under bump material follows a contour of the passivation layer;

forming and patterning a first photo-resist layer, so that a first opening aligned with the metal pad is formed, and the under bump material is exposed within the first opening;

forming a first bump material layer to fill the first opening;

forming and patterning a second photo-resist layer on the first photo-resist layer and the first bump material, so that at least a second opening is formed in the second photo-resist layer to expose a portion of the first bump material;

forming a second bump material layer to fill the second opening in the second photo-resist layer;

removing the first and the second photo-resist layers, so that the first bump material layer and the second bump material layer are combined as one trench style bump having at least a trench thereon; and removing a part of the under bump material with the trench style bump as a mask.

2. The method according to claim 1, wherein the metal pad includes an aluminum pad.

3. The method according to claim 1, wherein the under bump material comprises a titanium tungsten layer and a gold layer.

4. The method according to claim 1, wherein the first and the second bump material layers include a gold layer.

5. The method according to claim 4, wherein the gold layer is formed by deposition.

6. The method according to claim 4, wherein the gold layer is formed by plating.

7. The method according to claim 4, wherein the trench style bump includes a trench style gold bump.

8. A flip chip technique, which employs a silicon chip having a trench style bump, comprising:

providing a substrate, on which an anisotropic conductive film/anisotropic conductive past paste is formed, wherein the anisotropic conductive film/anisotropic conductive paste contains conductive particles;

laminating the silicon chip on the substrate, so that the silicon chip contacts with the substrate through the trench style bump; and vibrating the substrate laterally using an ultra sonic wave, and keeping the silicon chip pressed towards the substrate until the conductive particles are trapped in the trench style bump.

9. The technique according to claim 8, wherein the substrate includes a glass substrate with wiring built inside.

10. The technique according to claim 8, wherein the substrate includes a BGA printed circuit board.

* * * * *